(12) United States Patent
Prat et al.

(10) Patent No.: US 8,357,928 B2
(45) Date of Patent: Jan. 22, 2013

(54) RECORDING LEVEL GAUGE TYPE ORGANIC LIGHT EMITTING DIODE

(75) Inventors: Christophe Prat, Coueron (FR); David Vaufrey, Grenoble (FR); Philippe Le Roy, Betton (FR)

(73) Assignee: Thomson Licensing, Issy-les-Moulineaux (FR)

( * ) Notice: Subject to any disclaimer, the term of this patent is extended or adjusted under 35 U.S.C. 154(b) by 464 days.

(21) Appl. No.: 12/290,417

(22) Filed: Oct. 30, 2008

(65) Prior Publication Data

US 2010/0084635 A1    Apr. 8, 2010

(30) Foreign Application Priority Data

Oct. 30, 2007  (FR) ...................... 07 58702

(51) Int. Cl.
  *H01L 29/08*  (2006.01)
  *H01L 29/20*  (2006.01)
(52) U.S. Cl. .......................... 257/40; 257/89
(58) Field of Classification Search ............ 257/40, 257/89, E33.064, E51.022
  See application file for complete search history.

(56) References Cited

U.S. PATENT DOCUMENTS 7,294,856 B2 *  11/2007  Ito et al. ................ 257/72
2007/0278501 A1 *  12/2007  MacPherson et al. ........ 257/86

FOREIGN PATENT DOCUMENTS

| DE | 20 2005000979 U1 | 7/2006 |
| EP | 1515592 | 3/2005 |
| GB | 865957 | 4/1961 |
| WO | WO2006/003872 | 1/2006 |
| WO | WO2007/102103 | 9/2007 |

* cited by examiner

*Primary Examiner* — Hung Vu
(74) *Attorney, Agent, or Firm* — Myers Wolin, LLC

(57) ABSTRACT

Diode for which one of the conducting layers presents a suitable surface resistance so that when a power supply voltage is applied between a connection element and this conducting layer and the other conducting layer, a potential distribution is generated at the surface of this resisting conducting layer which is able to cause light to be emitted by a portion of the surface of the organic light emitting layer which is proportional to this power supply voltage. This diode is advantageously used to visualize the signal value.

7 Claims, 6 Drawing Sheets

RECORDING LEVEL GAUGE TYPE ORGANIC LIGHT EMITTING DIODE

This application claims the benefit, under 35 U.S.C. § 119 of European Patent Application No. 0758702, filed Oct. 30, 2007.

BACKGROUND OF THE INVENTION

1. Field of the Invention

It is known a recording level gauge type display device, comprising several light emitting diodes distributed in a row and connected to a control circuit and to a power supply device adapted to power each diode with a same predefined voltage value The command circuit is capable of receiving an input signal and of controlling sequentially and discretely the supply of a certain number of diodes according to the input signal value, such that the number of lit diodes is representative of the input signal.

This display device is notably used in radio sets to display the frequency of a radio signal.

However, this display device is complicated.

2. Description of the Prior Art

Document U.S. Pat. No. 3,928,864 describes a recording level gauge type display device comprising a single elongated diode in the form of a column, comprising, between two power supply electrodes that extend over the length of this columns, an inorganic light emitting layer and an insulating layer that also extend over the length of this column. One of the electrodes is resistive, such that when a supply voltage is applied between the electrodes a potential gradient is formed along the resistive electrode and the diode lights up to a column height, which is proportional to its supply voltage.

SUMMARY OF THE INVENTION

One purpose of the invention is to improve the signal display through a display device of a recording level gauge type.

For this purpose, one of the purposes of the invention is a light emitting diode comprising, on a substrate, at least one organic light emitting diode placed between a lower conducting layer and an upper conducting layer, where at least one of these conducting layers, being then said "resistive", presents, in certain zones at least of its surface, a suitable surface resistance so that when a supply voltage is applied between at least one "lower" connection elements connected with said lower conducting layer and at least one "upper" connection elements connected with said upper conducting layer, a potential distribution is generated on the surface of the said resistive conducting layer which is capable of provoking a light emission by a portion of the organic light emitting layer which is proportional to the said supply voltage, provided that the said supply voltage is between a given range of values, $[U_{th}, U_{ceil}]$, called the operating range.

In short, according to its supply voltage, the emitting surface of this diode varies from a zero value to a maximum value which corresponds to the whole organic light emitting layer surface which is between the two conducting layers. A simple and economical recording level gauge is therefore obtained, providing a visual indication of the level of its supply voltage. By means of a voltage generator capable of generating a voltage proportional to a signal, this diode enables a signal's value to be displayed.

In the case of a "column type recording level gauge", the resistive conducting layer takes the form of a column; generally only one connection element or "pin" is placed at one end of the column. Therefore, as the diode's supply voltage is increased, the emitting surface of this diode increases from this end of the column.

The light emitting diode is associated with an emission threshold voltage of at least one light emitting layer. When this diode is powered up, the portion of the surface of the organic light emitting layer that emits light corresponds to the conducting layer zones opposite each other between which there is a potential difference greater than the light emitting layer's emission threshold. In practice, the diode begins to emit light over a reduced portion of its surface once its supply voltage exceeds an operating threshold voltage $U_{th}$; at the other end of its operating range, the diode emits light over its whole emitting surface once its supply voltage reaches and operating ceiling $U_{ceil}$. The interval $[U_{th}, U_{ceil}]$ then forms the operating range for this diode.

Outside the diode's operating range, the portion of the diode's emission surface no longer depends on its power supply voltage; for a power voltage lower than the operating threshold voltage $U_{th}$, the diode no longer emits light; when its power supply voltage increases beyond the operating ceiling voltage $U_{ceil}$, the diode's emitting surface no longer increases.

The purpose of the invention is also a recording level gauge type display device comprising at least one light emitting diode according to the invention and its variable voltage supply resources connected to the lower and upper connection points on this diode, with the supply resources capable of generating a variable output value whose value is able to correspond to the value of an input signal to be displayed, when the variable voltage is applied between the diode's lower and upper connection points. This recording level gauge's display device is then suitable to provide a visual representation of the input signal's value.

All of the diode's layers are placed on a substrate. Generally, one of the conducting layers, whether lower or upper, acts as an anode and the other acts as a cathode. Preferably, at least one of the two conducting layers is transparent or semi-transparent to the light emitted. Depending on the circumstances, the transparent conducting layer is in contact with the substrate and the diode is then back emitting through the substrate; or the transparent conducting layer is in contact with the substrate and the diode is then back emitting or in bottom emission through the substrate.

Preferably, between at least one conducting layer and at least one organic light emitting layer the diode comprises an organic charge transport layer: transport of electrons from the side of the conducting layer acting as a cathode, transport of holes on the side of the conducting layer acting as an anode. This transport layer may be made from undoped semi-conductor material, or doped by acceptor doping or electron donor doping. Preferably, between this charge transport layer and at least one organic light emitting layer, the diode comprises one organic or mineral charge blocking layer: blocking of the holes on the side of the electron transport layer, blocking of electrons on the side of the hole transport layer.

The light emitting layer's organic material is adapted to emit light in a given colour by combining electrons and holes within itself. The emission may be intrinsic to the base material of this layer and/or come from one or more doping luminescent or phosphorescent elements on this layer. For example, the emission colour may be green, red or blue.

Preferably, the distribution of the emission colours over the said surface portion of the organic layer which emits light also varies according to the said potential distribution to the surface of the said resistive conducting layer. Advantageously, when this diode is used to display a signal value, not only is a visual display of the signal level obtained as earlier, but a different colour is also obtained according to the level: for example, for a speed indicator, this enables the low speed levels to be displayed in a dominant green colour and the high speed levels to be displayed in a dominant red colour with composed intermediate colours, such as yellow, for intermediate levels. One other advantage is that even when the power supply voltage increases beyond the operating ceiling voltage over which the emitting surface no longer varies, the colour distribution in this surface continues to change according to the power supply voltage. A recording level gauge type diode is then obtained, providing more numerous visual indicators on the level of its power supply voltage, i.e. on the level of signal to be displayed.

Preferably, according to a first variable colour distribution diode variant, the diode comprises a single organic light emitting layer. Prior art proposes several solutions to obtain an organic light emitting layer whose emission spectrum depends on the difference in potential applied to this layer:

The article entitled "Spectral tuning of electroluminescence in conjugated copolymers by application of an external electric field" by D. DAVIDOV et al., published in March 1996 in the review Advanced Materials, vol. 8, No. 3, pp. 234-237, which describes an adapted copolymer system;

The article entitled "Voltage color tunable OLED with (Sm, Eu)-β-diketonate complex blend" by R. REYES et al., published on 21 Sep. 2004 in Chemical Physics Letters, vol. 396, No. 1-3, pages 54-58, which proposes using (Sm, Eu)-β-diketonate complex mixes to produce the light emitting layer;

The article entitled "Energy transfer in the color-tunable organic electroluminescence by voltage modulation" by Ting ZHANG et al., published in December 2001 in the review Chinese Journal of Luminescence, vol. 22, no. 4, pp. 347-350, which uses doping of the organic light emitting layer by a colourant;

The article entitled "Voltage tunable multicolor light emitting diodes based on a dye-doped polythiophene derivative" by A. KAUR et al., published on 14 Feb. 2002 in the review Synthetic Metals, vol. 126, no. 2-3, pp. 283-288, which also uses organic light emitting layer doping using a colourant;

Documents U.S. Pat. No. 6,229,505, JP6342690, JP6093257A.

Preferably, according to a second variable colour distribution diode variant, the diode comprises, between the two said conducting layers, a plurality of organic light emitting layers placed on top of each other which are capable of emitting different coloured lights. The organic material of each organic light emitting layer is preferably adapted to emit light of a given colour. For example, in the case of three organic light emitting layers there may be a first layer likely to emit green light, a second layer likely to emit red light and a third layer likely to emit blue light; therefore when the three layers emit simultaneously within a given proportion of light, the overall light emitted by the diode may present a white tint.

Intermediate layers may be placed between these different organic light emitting layers. Prior art proposes several solutions to obtain an organic light emitting layer stack adapted to obtain an emission spectrum which depends on the difference in potential applied to this stack:

The article entitled "Color-tunable multilayer light-emitting diodes based on conjugated polymers" by CC. HUANG et al., published on 16 Feb. 2004 in the review Applied Physics Letters, vol. 84, no. 7, pp. 1195-1197 proposes the stacking of three organic light emitting layers, one for red, another for green and a third for blue;

The article entitled "Voltage-tuneable-colour triple-layer organic light emitting diodes" by Liu ZUGANG et al., published in 1998 in Proceedings of the SPIE—The International Society for Optical Engineering, vol. 3175, pp. 142-145, 1998.

The maximum diode emission surface, which corresponds to the whole surface of the organic light emitting surface placed between the two conducting layers, may present a polygon or even star shape. Like this polygon shape, for example there may also be a triangular shape, a rectangular shape, notably in a column, a square shape or a pentagon shape.

Preferably, the surface of at least one "resistive" conducting diode layer according to the invention therefore presents a polygon shape and at least three sides and a connection element connected to this layer is arranged along two adjacent or opposite sides.

The different connection elements are preferably connected to the same potential, notably by an adapted conductor.

In the case of a column shaped resistive conducting layer, a connection element or "pin" is placed at each end of the column. Therefore, as the diode's supply voltage is increased, the emitting surface of this diode increases from the two ends of the column.

Therefore, in the case of a triangle shaped resistive conducting layer, a connection element is placed along at least two sides of the triangle. A silver electrode placed by screen printing on the triangle sides may notably be used as a connection element.

Preferably, the surface of at least one of the diode's "resistive" conducting layers according to the invention presents a polygon or star shape with at least three vertices and a connection element or "pin" connected to this layer is arranged on each of the said vertices. Therefore, as the diode's supply voltage is increased, the emitting surface of this diode increases from each resistive conducting layer vertex.

The different connection pins are preferably connected to the same potential, notably by an adapted conductor.

Preferably, at least one diode "resistive" conducting layer has a transparent conducting oxide base, such as ITO ("Indium Tin Oxide").

The purpose of the invention is also a device comprising multiple diodes according to the invention, for which the lower connection elements are connected to each other, the upper connection elements are connected to each other, where, a specific operating range is associated with each diode, characterised in that the operating range of each diode presents at least one part, generally central, which does not belong to the operating range of any other diode of the said device and at least one other part, generally the end, which belongs to the operating range of at least one other diode of the said device.

The different diodes in this device are therefore connected in parallel. One advantage of this device is that it enables the level of voltage to be displayed within a very wide range of values, with the diodes taking over from each other to display the voltage level. As soon as, or even before, the voltage exceeds a diode's operating ceiling voltage, another diode begins to emit because this voltage corresponds to the operating threshold voltage of this other diode.

BRIEF DESCRIPTION OF THE DRAWINGS

The invention will be better understood upon reading the following description, provided for information only and referring to the annexed drawings wherein.

DESCRIPTION OF THE PREFERRED EMBODIMENTS

The diode 10 will now be described according to a first embodiment of the invention, intended to be used to display an input signal via a specific variable voltage generator to receive this input signal and to deliver, at the output, a diode supply voltage that is proportional to the input signal to be displayed.

Figure 1:
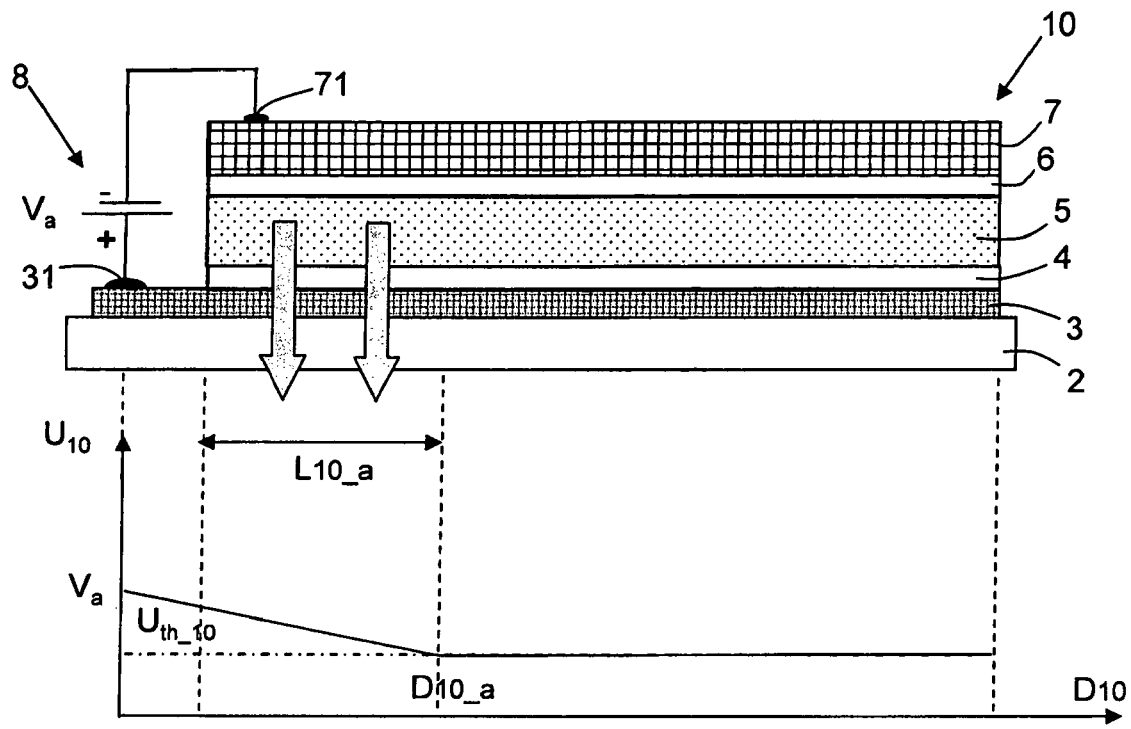
FIGS. 1 and 2 show a cross-section of a diode according to a first embodiment for the invention, as well as a distribution of the potential along the surface of this diode's resistive conducting layer, respectively for a $V_a$ and $V_b$ supply voltage.
Figure 2:
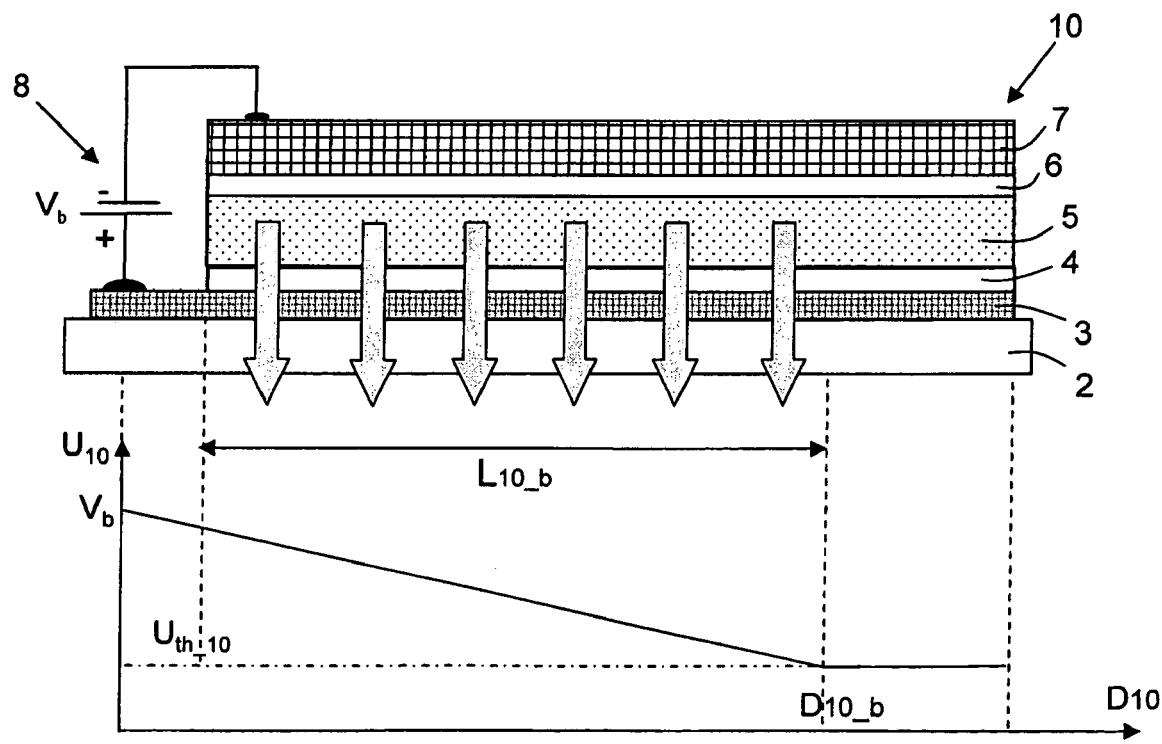

In reference to FIGS. 1 and 2, this diode 10 comprises a substrate on which is placed a lower conducting layer 3 which here is transparent and resistive and acts as an anode. Notably ITO will be used for this layer. The constant thickness of this layer is determined as mentioned below; it is generally between 40 and 200 nm. On this lower conducting level 3, a hole transport layer 4 will be placed, along with an organic light emitting layer 5, an electron transport layer 6 and an upper conducting layer 7, which here is reflective. Metal will be used preferably for this layer. This metal layer is thick enough to be totally reflective to the light emitted by the diode and, when the diode emits light, to obtain an approximately uniform distribution of the potential over the full surface of this layer. For example, aluminium is well adapted for this layer, owing to its high reflectivity and high conductivity. For example, the thickness of this layer is 200 nm.

The organic light emitting layer 5 here is a layer with a constant thickness, of around 40 nm, which is formed for example from aluminium Alq3 tris-(8-hydroxyquinoline).

To supply the diode, one lower connection element or pin 31 is applied to the contact on one end of the lower conducting layer and an upper connection element 71 is applied to the contact of the upper conducting layer. Each of the two variable voltage generator output terminals is connected to one of the connection elements, lower 31 or upper 71 on the diode. The diode is therefore powered via these connection elements.

The whole surface of the organic light emitting layer 5 that is placed between the two conducting layers forms the maximum emitting surface for the diode. The surfaces of the different layers are adapted so that this maximum emitting surface takes the rectangular shape of a column. Variants of this column shape will be described later in the reference to FIGS. 10 and 11.

Substrate 2 is composed of a transparent plate, for example made of glass or plastic. It has a thickness of between 0.7 and 1.1 millimeters. Substrate 2 has a first main side on which the lower conducting layer 3 is secured and a second main side opposite the first main side. The second main side comprises a rectangular area in the shape of a column, specifically to be crossed by the light emitted by diode 10 and a graduated scale secured along this area. This area is called the display surface throughout this description. This area corresponds to the maximum emissive surface of the diode. The scale is graded continuously along a range of values that correspond to the possible values of the input signal to be displayed.

The output voltage value delivered by the variable voltage generator specifically corresponds to the value of the input signal according to pre-established mapping. The mapping is produced during a learning phase to ensure that the different possible values of the input signal correspond to the voltage values to be applied to the diode 10 so that the lit area on the display surface corresponds to the value of the input signal on the graded scale.

The thickness of lower resistive conducting layer 3, and therefore the surface resistivity that results, is adapted so that when the voltage generator applies a power supply voltage to this diode 10, a potential distribution is generated to the surface of this resistive conducting layer 3 which is capable, depending on this supply voltage, of causing a variation in this diode's emission surface and therefore the lit area on the display surface.

Figure 3:
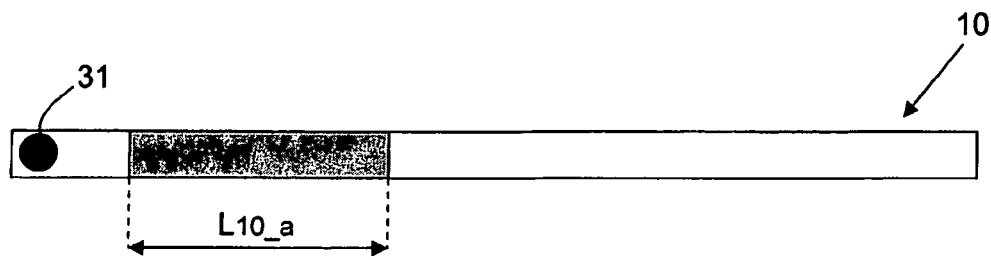
FIGS. 3 and 4 show a top view of the display on the diode in FIG. 1, respectively for a $V_a$ and $V_b$ supply voltage.

In operation, an input value $S_a$ of an input signal is applied to the variable voltage generator which generates a voltage $V_a$ with a value that corresponds to the input value $S_a$. This value $V_a$ of the diode's supply voltage here is greater than an operating threshold voltage $U_{th\_10}$. Distribution of potential $U_{10}$ then obtained along lower conducting surface 3, in the form of a column, is shown at the bottom of FIG. 1, according to distance $D_{10}$ on connection element 31 on resistive conducting layer 3. The limit $D_{10\_a}$ in the constant potential area corresponds to the diode's emission surface and therefore defines, in reference to FIGS. 1 and 3, the length $L_{10\_a}$ of the part of emission layer column 5 which then emits light. When voltage $V_a$, for example with a value equal to 2.5 V, powers the diode, a portion of the display surface lights up so that the input signal value $D_a$ corresponding to voltage $V_a$ may be read on the graded scale by the user. The length $L_{10\_a}$ of emission layer column 5 which emits light corresponds to conducting layer areas 3, 7 opposite each other between which there is a difference in potential which is greater than the emission threshold voltage of light emitting layer 5, with close falls in potential through transport layers 4 and 6 or any other intermediate layers. This emission threshold voltage depends on the nature and thickness of the organic light emitting layer and the transport layers.

Figure 4:
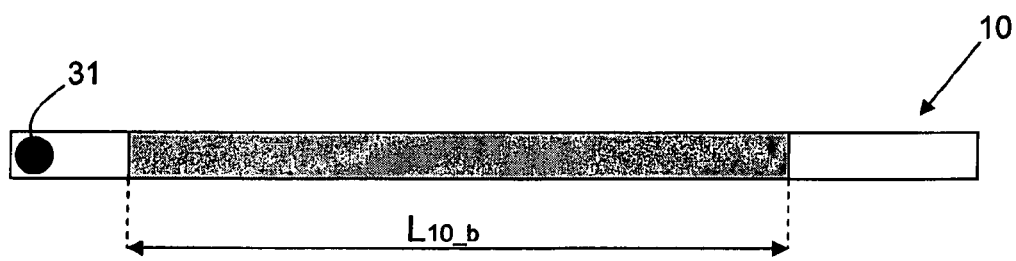

Then, an input value $S_b > S_a$ of an input signal is applied to the variable voltage generator, which generates a voltage $V_b > V_a$ with a value that corresponds to the input value $S_b$. It is considered here that the voltage $V_b$ is lower than an operating ceiling voltage $U_{ceil\_10}$. The distribution of the potential $U_{10}$ that is obtained along the lower conducting surface 3, in the form of a column, is represented at the bottom of FIG. 2 according to the distance $D_{10}$ to connection element 31 on resistive conducting layer 3. The limit $D_{10\_b}$ of the constant potential area corresponds to the limit of the diode's emitting surface and therefore defines, in reference to FIGS. 2 and 4, the length $L_{10\_b}$ of the part of emission layer column 5 which then emits photons. When voltage $V_b$, for example with a value equal to 2.8 V, powers the diode, a portion of the display surface lights up so that the input signal value $S_b$ corresponding to voltage $V_b$ may be read on the graded scale by the user. As the voltage value $V_b$ is greater than the voltage value $V_a$, the length $L_{10\_b}$ is greater than the length $L_{10\_a}$ as the conducting areas 3, 7 opposite other between which there is a difference in potential greater than the emission threshold voltage of the light emitting layer 5 extends over a greater length $L_{10\_b}$.

Therefore, diode 10 provides a visual representation of the input signal's values $S_a$ and $S_a$. In practice, diode 10 begins to emit light over a reduced portion of its surface once its power supply voltage exceeds an operating threshold voltage $U_{th\_10}$; at the other end of its operating range, the diode emits light over its whole emitting surface once its power supply voltage reaches and operating ceiling $U_{ceil\_10l}$. The interval [$U_{th\_10}$, $U_{ceil\_10}$] then forms the operating range for this diode. By interpolation, the diode is likely to provide a representation of multiple values $S_X$ of the input signal, provided that value $V_X$ of the voltage that corresponds to this signal is within this operating range [$U_{th\_10}$, $U_{ceil\_10}$].

Outside this operating range, the portion of the diode's emission surface no longer depends on its power supply voltage; for a power supply voltage lower than the operating threshold voltage $U_{th\_10}$, the diode no longer emits light; when its power supply voltage increases beyond the operating ceiling voltage $U_{ceil\_10}$, the diode's emitting surface no longer increases.

As a variant of diode 10 described above, there are diodes:
  With at least one extra charge blocking layer: hole blocking on the side of the electron transport layer, electron blocking on the side of the hole transport layer,
  For which one of the transport layers is light emitting, or doped with a photoluminescent doping,
  For which at least one of the conducting layers is made from conducting polymer,
  For which at least one of the conducting layers is composite, i.e. formed from several sub-layers.

Figure 10:
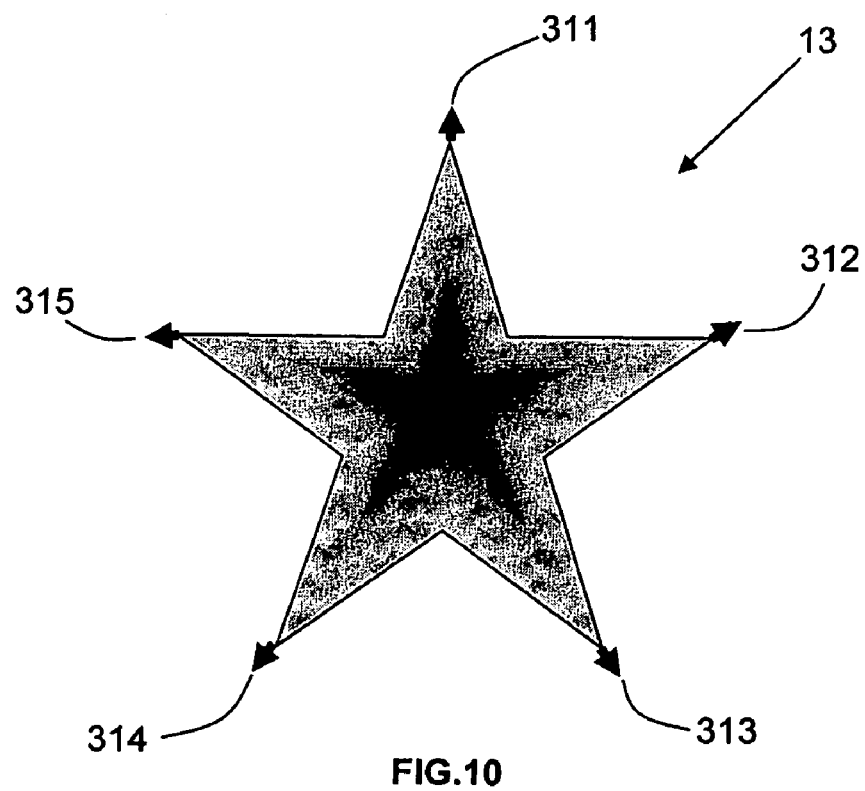
FIGS. 10 and 11 show variants essentially concerning the shape of the emission surface for the diode in FIG. 1.
Figure 11:
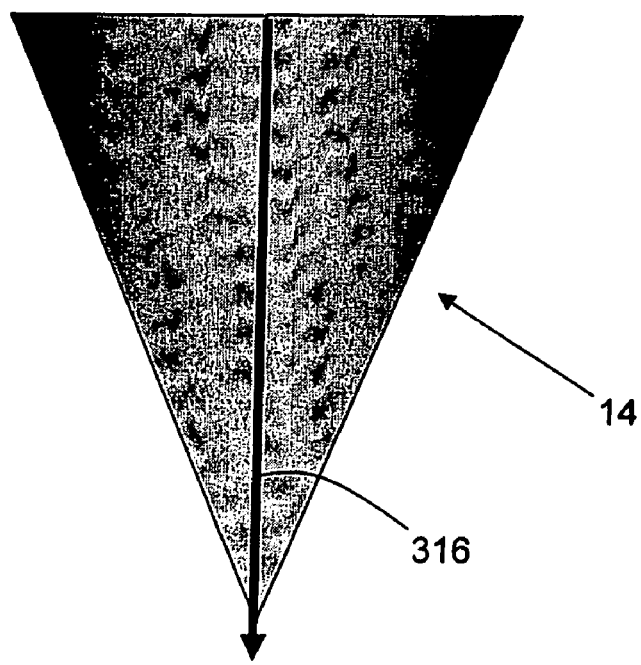

FIGS. 10 and 11 show variants concerning the shape of the diode's emission surface and the connection elements connected to this diode's resistive conducting layer:
  Diode 13 with a resistive conducting layer and an emitting layer in the shape of a 5-arm star in FIG. 10, with a connection element at the end of each arm; all the connection elements 311, 312, 313, 314, 315 are connected to the same potential by an external conductor that is not shown; therefore, as the diode's power supply voltage is increased, this diode's emitting surface increases from each star vertex to its centre.
  Diode 14 with a resistive conducting layer and an emitting layer in the shape of a triangle in FIG. 11, with a connection element formed by an electrode 316 applied to the centre of the triangle over its entire height; therefore as the diode's power supply voltage rises, this diode's emission surface increases from the centre to the two opposite vertices of the triangle.

The forms of the different layers of diodes 13, 14 are adapted in a known manner in itself to obtain these different emissive surface forms.

The second embodiment of a diode will now be described, according to the invention in which the distribution of emission colours on the diode's emission surface or the lit part of the display surface varies according to the diode's power supply voltage.

Figure 9:
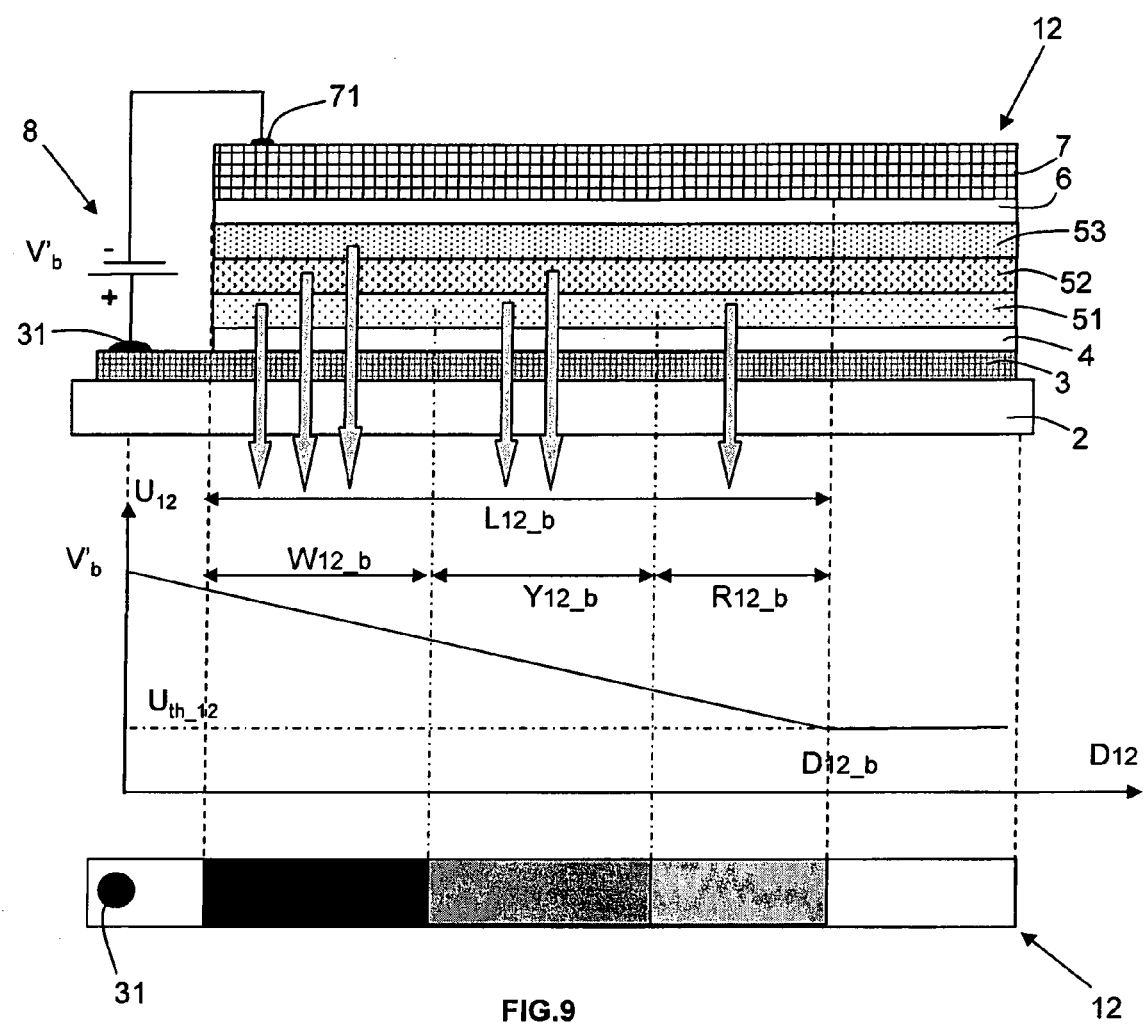
FIG. 9 shows a cross-section of a diode according to a second method for producing the invention, as well as the distribution of the potential along the surface of this diode's resistive conducting layer for a supply voltage $V'_b$, and the distribution in three zones of the different emission colours on the emission surface.

In reference to FIG. 9, diode 12 according to this embodiment is identical to 10 which has just been described, with the slight difference in that it comprises three organic light emitting layers placed on top of each other, capable of emitting different colours, a first 51 for the red, a second 52 for the green and a third 53 for the blue. In the article entitled "Color-tunable multilayer light-emitting diodes based on conjugated polymers" by CC. HUANG et al., there are useful indications for producing such a diode.

This light emitting diode 12 is associated, as earlier, with an emission threshold voltage for all of the light emitting layers. As earlier, when this diode is powered up with a voltage $V'_b$, the portion of the surface of the organic light emitting layer that emits light corresponds to the conducting layer zones opposite each other between which there is a potential difference greater than the light emitting layer's emission threshold $U_{th\_12}$ for all of the light emitting layers. But the difference here is that this difference in potential between these conducting layer areas is distributed differently between organic light emitting layers placed on top of each other according to the value of this potential difference. This variation in potential distribution in the thickness of the organic light emitting layers 51, 52, 53 then induces different emission levels for each organic light emitting layer and, as these different organic light emitting layers emit different colours, this difference in potential distribution in the thickness induces variations in the diode's global emission colour.

As shown in FIG. 9, for a power supply voltage $V'_b$ within the operating interval [$U_{th\_12}$, $U_{ceil\_12}$], the emission surface extends over a length $L_{12\_b}$ and is distributed in three areas:
  An area $R_{12\_b}$ where only organic light emitting layer 51 emits red light; in this area $R_{12\_b}$, the potential distribution in the thickness of the light emitting layer stack is such that only layer 51 emits light,
  An area $Y_{12\_b}$ where organic light emitting layer 51 emits red light and organic light emitting layer 52 emits green light, with the combination in emissions producing a yellow tint; in this area $Y_{12\_b}$, the potential distribution in the thickness of the light emitting layer stack is such that only layer 53 does not emit light,
  An area zone $W_{12\_b}$ where organic light emitting layer 51 emits red light, organic light emitting layer 52 emits green light and organic light emitting layer 53 emits blue light, with the combination in emissions producing a white tint; in this area $W_{12\_b}$, the potential distribution in the light emitting layer stack is such that all layers emit light.

Therefore, one advantage of this preferential variant of the invention is that not only does the emission surface of the diode but also the colour distribution in this emission surface depend on the diode's power supply voltage. One other advantage is that even when the power supply voltage increases beyond the operating ceiling voltage over which the emitting surface no longer varies, the colour distribution in this surface continues to change according to the power supply voltage. A recording level gauge is therefore obtained, providing more numerous visual indications of the level of its power supply voltage.

When this diode is used to display a signal value, as described for example in the first embodiment, not only is a visual display of the signal level obtained as earlier, but a different colour is also obtained according to this level: for example, for a speed indicator, this enables the low speed levels to be displayed in a dominant white colour and the high speed levels to be displayed in a dominant red colour with composed intermediate colours, such as yellow, for intermediate levels.

An embodiment for a device that conforms to the invention will now be described. In reference to FIGS. 5 to 8, this device comprises two diodes of the type previously described: a first diode 10 previously described, presenting an operating interval [$U_{th\_10}$, $U_{ceil\_10}$] between an operating threshold voltage $U_{th\_10}$ and an operating ceiling voltage $U_{ceil\_10}$, and a second diode 11, presenting another operating interval [$U_{th\_11}$, $U_{ceil\_11}$] between another operating threshold voltage $U_{th\_11}$ and another operating ceiling voltage $U_{ceil\_11}$, The second diode 11 differs here only from the first diode 10 in the greater thickness of its organic light emitting layer which produces a higher value of the emission threshold voltage. As a variant, the thickness of the other layers between the electrodes may be increased. According to another variant, the second diode 11 differs notably from the first diode in the nature of its organic light emitting layer, selected to obtain not just a higher emission threshold voltage value, but also a different emission colour. As the organic light emitting layer of diode 11 presents an emission threshold greater than the first diode 10's emission threshold, there is $U_{th\_11} > U_{th\_10}$. In this device, these two diodes are connected in parallel to the same variable voltage generator as earlier.

The thickness and, where applicable, the nature of the second diode 11's organic light emitting layer are selected to satisfy the following conditions:
- $Uth\_11$ is slightly lower than $U_{ceil\_10}$, so that the operating range of the second diode 11 slightly cuts the operating range of the first diode 10,
- $U_{ceil\_11}$ is much greater than $U_{ceil\_10}$, and $U_{th\_11}$ is much greater than $U_{th\_10}$, so that the majority of the operating range of the second diode 11 is disjointed from the majority of the first diode 10's operating range.

Figure 5:
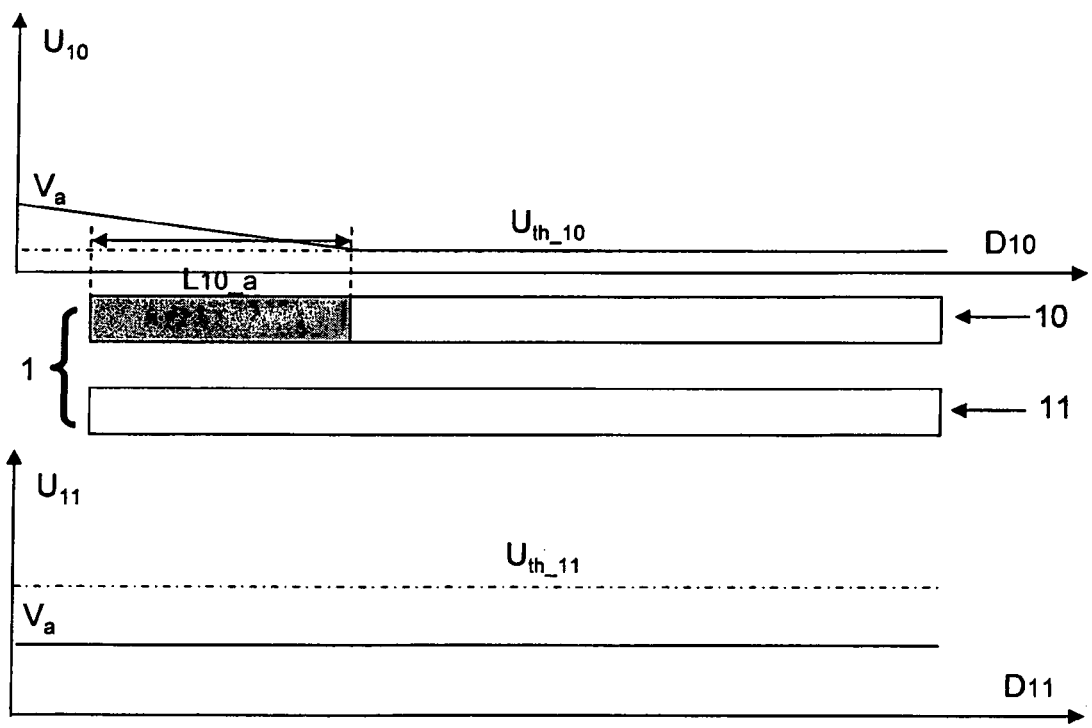
FIGS. 5 to 8 show a top view of a device according to a method for producing the invention comprising two 10, 11 diodes according to the first method for producing the invention as well as the distribution of the potential along the surface of the resistive conducting surface for these diodes, respectively for a $V_a$, $V_b$, $V_c$, $V_d$ supply voltage.
Figure 6:
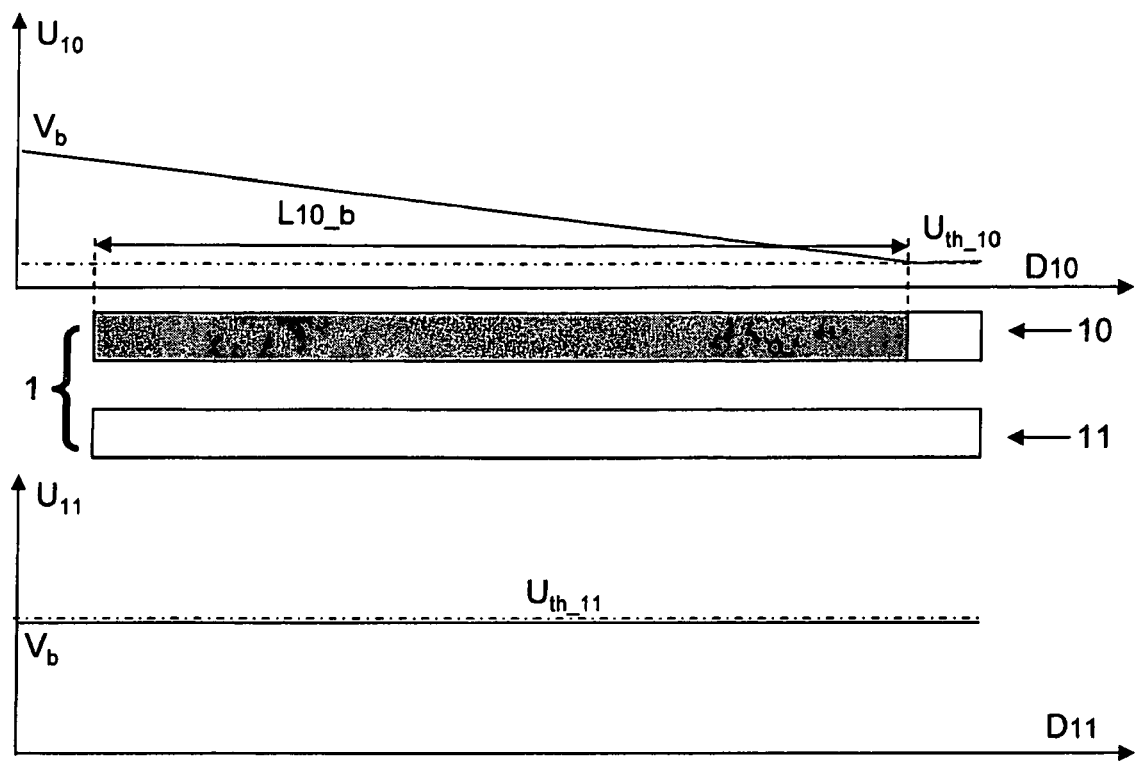
Figure 7:
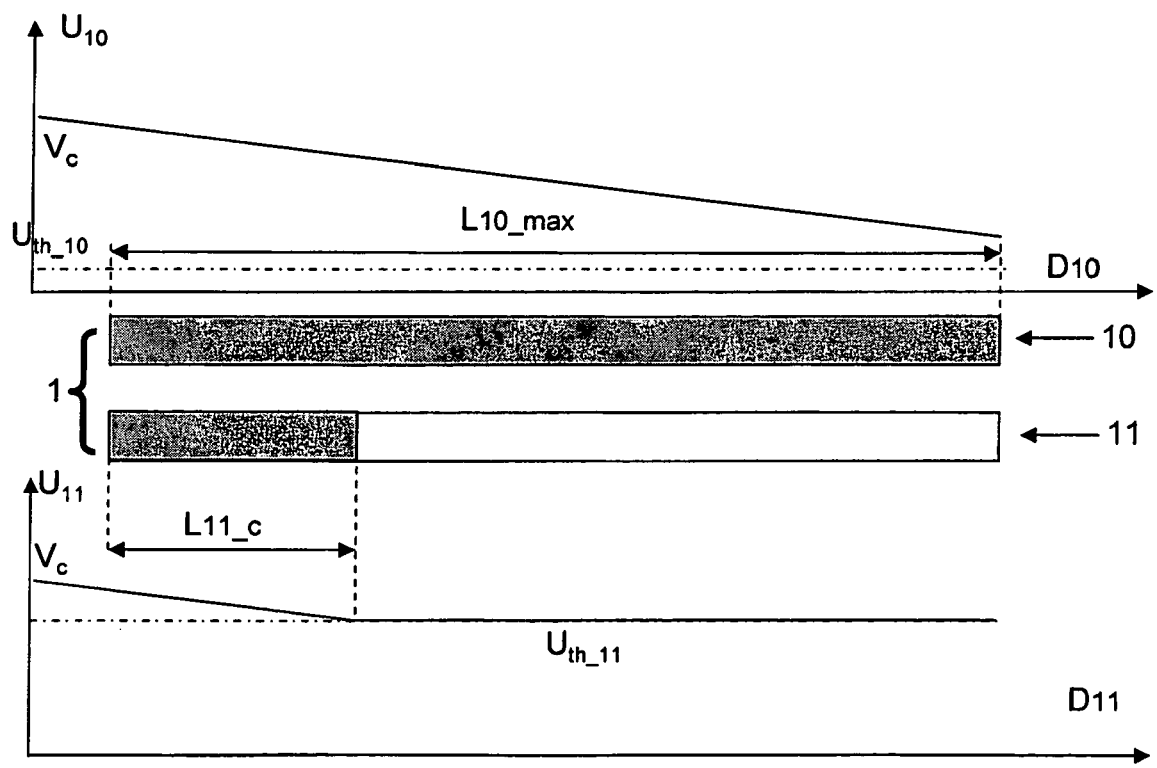
Figure 8:
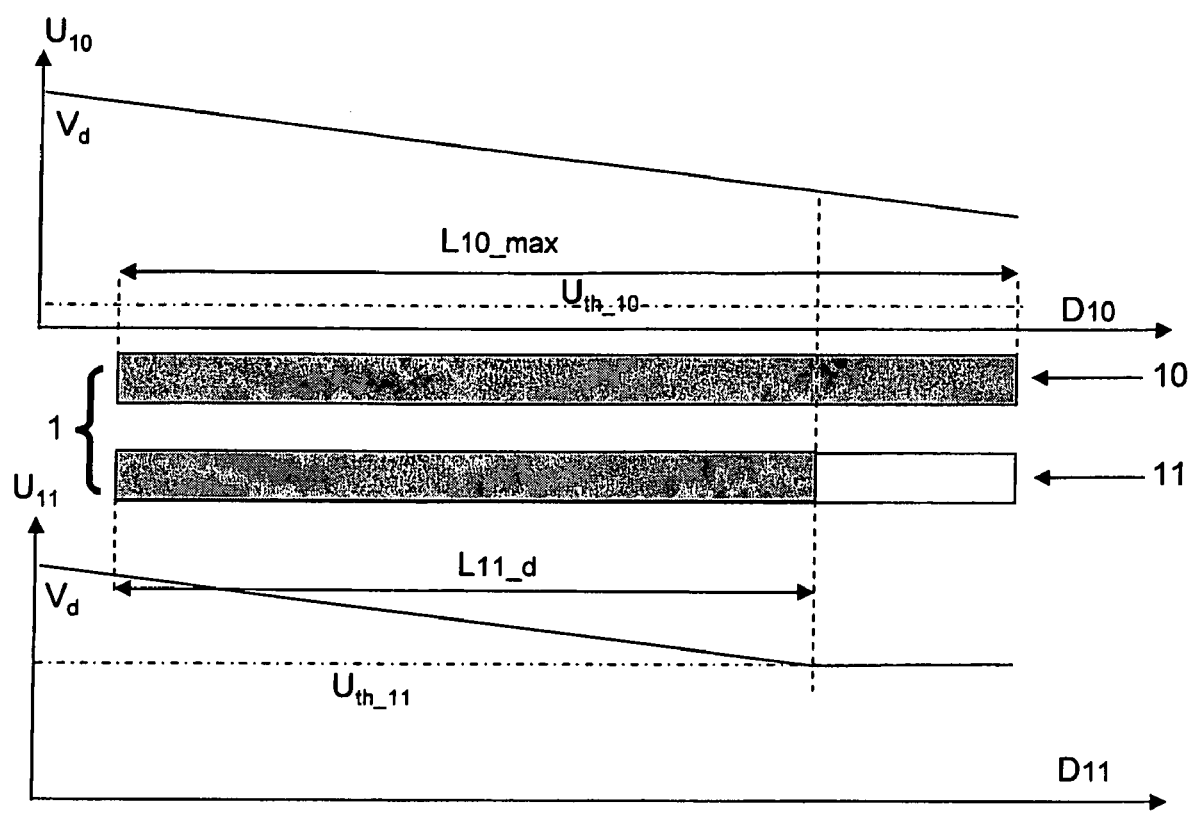

The display state of the device according to the invention will now be described for four power supply voltages different from the two diodes of the device $V_a, V_b, V_c, V_d$ selected so that $V_{th\_10} < V_a < V_b < V_{th\_11} < U_{ceil\_10} < V_c < V_d < V_{ceil\_11}$:
- In reference to FIG. 5, for the power supply voltage $V_a$, the potential distribution $U_{10}$ obtained along the lower conducting surface of diode 10 is shown at the top of FIG. 5, according to distance $D_{10}$ to the connection element on the resistive conducting layer of this diode. As $V_a > V_{th\_10}$, the part of the emission layer column of the diode 10 that then emits photos presents a non null length $L_{10\_a}$. Moreover, the potential distribution $U_{11}$ obtained along the lower conducting surface of diode 11 is shown in the bottom of FIG. 5, according to the distance $D_{11}$ to the connection element on the resistive conducting layer of this diode. As $V_a < U_{th\_11}$, this diode 11 does not emit light;
- In reference to FIG. 6, for the power supply voltage $V_b$, the potential distribution $U_{10}$ obtained along the lower conducting surface of diode 10 is shown at the top of FIG. 6, according to distance $D_{10}$ to the connection element on the resistive conducting layer of this diode. The part of the emission layer column of diode 10 that then emits photons presents a length $L10\_b$. Moreover, the potential distribution $U_{11}$ obtained along the lower conducting surface of diode 11 is shown in the bottom of FIG. 6, according to the distance $D_{11}$ to the connection element on the resistive conducting layer of this diode. As there is still $V_b < U_{th\_11}$, this diode 11 does not emit light;
- In reference to FIG. 7, for the power supply voltage $V_c$, the potential distribution $U_{10}$ obtained along the lower conducting surface of diode 10 is shown at the top of FIG. 7, according to distance $D_{10}$ to the connection element on the resistive conducting layer of this diode. As $V_c > U_{ceil\_10}$, the entire emission layer column of diode 10 then emits photons. Moreover, the potential distribution $U_{11}$ obtained along the lower conducting surface of diode 11 is shown in the bottom of FIG. 7, according to $D_{11}$ to the connection element on the resistive conducting layer of this diode. As $V_c > U_{th\_11}$, part the emission layer column of diode 11 which then emits photons then presents a non null length null $L_{11\_c}$,
- In reference to FIG. 8, for the power supply voltage $V_d$, the potential distribution $U_{10}$ obtained along the lower conducting surface of diode 10 is shown in the top of FIG. 8, according to the distance $D_{10}$ to the connection element on the resistive conducting layer of this diode. As there is still $V_c > U_{ceil\_10}$, the entire emission layer column of diode 10 then emits photons. Moreover, the potential distribution $U_{11}$ obtained along the lower conducting surface of diode 11 is shown in the bottom of FIG. 8, according to $D_{11}$ to the connection element on the resistive conducting layer of this diode. The part of the emission layer column of diode 11 that then emits photons thus presents a length $L_{11\_d}$.

As can be seen, one advantage of this device is that it enables the level of voltage to be displayed within a very wide range of values, with diode 11 taking over from diode 10 to display the voltage level. Even before the voltage to be displayed exceeds the operating ceiling voltage $U_{ceil\_10}$ of diode 10, the other diode 11 begins to emit and display.

It is clear for those skilled in the art of light emitting diodes and recording level gauge type displays that this invention applies to diodes with various forms of emissive surface, to diodes with different locations for the connection elements on the conducting layers, to diodes with various emission colours, to diodes for which both conducting layers are resistive and to devices with colour variation diodes as described above.

The invention claimed is:

1. Light emitting diode comprising, on a substrate, at least one organic light emitting layer placed between a lower conducting layer and an upper conducting layer, without any further conducting layer between said lower conducting layer and said upper conducting layer, wherein at least one of said upper and lower conducting layers presents a suitable surface resistance distribution so that when a supply voltage is applied between an at least one "lower" connection element connected to said lower conducting layer and an at least one "upper" connection element connected to said upper conducting layer, a distribution of potential is generated on the surface of the at least one of said upper and lower conducting layers that is capable of provoking a light emission by a surface portion of the at least one organic light emitting layer which is proportional to the said power supply voltage, such that said surface portion provides a visual representation of the value of said power supply voltage, provided that the said power supply voltage is between a given range of values, [$U_{th}$, $U_{ceil}$], called the operating range, wherein the distribution of the emission colours over said surface portion of the at least one organic light emitting layer which emits light varies according to said potential distribution on the surface of said at least one of said upper and lower conducting layers such that said distribution of the emission colours depends on said power supply voltage in order to complement the visual representation of the value of said power supply voltage.

2. Diode according to claim 1, wherein the diode comprises a single organic light emitting layer.

3. Diode according to claim 1, wherein it comprises, between the said conducting layers, a plurality of organic light emitting layers placed on top of each other which are capable of emitting different coloured lights.

4. Diode according to claim 1, wherein the surface of the at least one of the upper and lower conducting layers presents a polygon shape with at least three sides and wherein a connection element connected to this layer is arranged along two sides, either adjacent or opposite.

5. Diode according to claim 1, wherein the surface of at least one of the upper and lower conducting layers presents a polygon or star form having at least three vertices and wherein a connection element or "pin" connected to this layer is arranged on each of the said vertices.

6. Diode according to claim 1, wherein at least one of the upper and lower conducting layers has a transparent conducting oxide base.

7. Device comprising a plurality of diodes according to claim 1, for which the lower connection elements are connected to each other, for which the upper connection elements are connected to each other, where, a specific operating range is associated with each diode, wherein the operating range of each diode presents at least one part that does not belong to the operating range of any other diode of the said device and at least one other part which belongs to the operating range of at least one other diode of the said device.

* * * * *